United States Patent
Doerr et al.

(10) Patent No.: US 10,554,014 B1
(45) Date of Patent: Feb. 4, 2020

(54) SHORTED P-N JUNCTION

(71) Applicant: ACACIA COMMUNICATIONS, INC., Maynard, MA (US)

(72) Inventors: Christopher Doerr, Middletown, NJ (US); Li Chen, Edison, NJ (US); Long Chen, Marlboro, NJ (US)

(73) Assignee: Acacia Communications, Inc., Maynard, MA (US)

( * ) Notice: Subject to any disclaimer, the term of this patent is extended or adjusted under 35 U.S.C. 154(b) by 0 days.

(21) Appl. No.: 15/857,997

(22) Filed: Dec. 29, 2017

(51) Int. Cl.
| H01S 3/063 | (2006.01) |
| H01S 5/042 | (2006.01) |
| H01S 5/026 | (2006.01) |
| H01S 5/068 | (2006.01) |
| H01S 5/10 | (2006.01) |
| H01S 3/083 | (2006.01) |
| H01S 3/30 | (2006.01) |
| H01S 3/106 | (2006.01) |
| H01S 3/137 | (2006.01) |

(52) U.S. Cl.
CPC .......... *H01S 5/0422* (2013.01); *H01S 3/0637* (2013.01); *H01S 3/083* (2013.01); *H01S 3/1062* (2013.01); *H01S 3/137* (2013.01); *H01S 3/30* (2013.01); *H01S 5/026* (2013.01); *H01S 5/068* (2013.01); *H01S 5/1071* (2013.01)

(58) Field of Classification Search
CPC .......... H01S 5/0422; H01S 5/026; H01S 3/30; H01S 3/083; H01S 3/063; H01S 3/0637; H01S 3/1062; H01S 3/137; H01S 5/1028; H01S 5/1071; H01S 5/142
See application file for complete search history.

(56) References Cited

U.S. PATENT DOCUMENTS

| 6,345,062 | B1 | 2/2002 | Taguchi et al. |
| 7,489,439 | B2* | 2/2009 | Kuo ............ H04B 10/2916 |
| | | | 359/334 |
| 8,295,655 | B2 | 10/2012 | Manipatruni et al. |
| 2002/0140054 | A1* | 10/2002 | Matsushita ........ H01L 27/0814 |
| | | | 257/546 |
| 2002/0153039 | A1* | 10/2002 | Moon ............ H01L 31/022425 |
| | | | 136/256 |
| 2009/0122817 | A1 | 5/2009 | Sato et al. |
| 2010/0044676 | A1* | 2/2010 | Sargent .............. B82Y 20/00 |
| | | | 257/21 |
| 2012/0171804 | A1* | 7/2012 | Moslehi .............. B23K 26/073 |
| | | | 438/71 |
| 2015/0212346 | A1* | 7/2015 | Zheng .................. G02F 1/025 |
| | | | 398/186 |
| 2017/0222398 | A1* | 8/2017 | Zilkie ................ H01S 5/06256 |

OTHER PUBLICATIONS

Rong, "Low threshold continuous wave Raman silicon laser," Apr. 2007, nature photonics, vol. 1, pp. 232-237.*
Gajda et al., "Design rules for p-i-n. diode carriers sweeping in nano-rib waveguides on SOI," Optics Express, vol. 19, No. 10, pp. 9915-9922, 2011.
Kobayashi et al., "Silicon Photonic Hybrid Ring-Filter External Cavity Wavelength Tunable Lasers," Journal of Lightwave Technology, vol. 33, No. 6, pp. 1241-1246, 2015.

* cited by examiner

*Primary Examiner* — Michael Carter
(74) *Attorney, Agent, or Firm* — Joseph D'Angelo

(57) ABSTRACT

A method and apparatus for removing free carriers from a waveguide using a p type semiconductor and an n type semiconductor connected by a short.

20 Claims, 6 Drawing Sheets

SHORTED P-N JUNCTION

BACKGROUND

A photonic integrated circuit usually includes optical components integrated on a substrate.

BRIEF DESCRIPTION OF THE FIGURES

Various aspects and embodiments of the application will be described with reference to the following example embodiments. It should be appreciated that the figures are not necessarily drawn to scale.

SUMMARY

Figure 1:
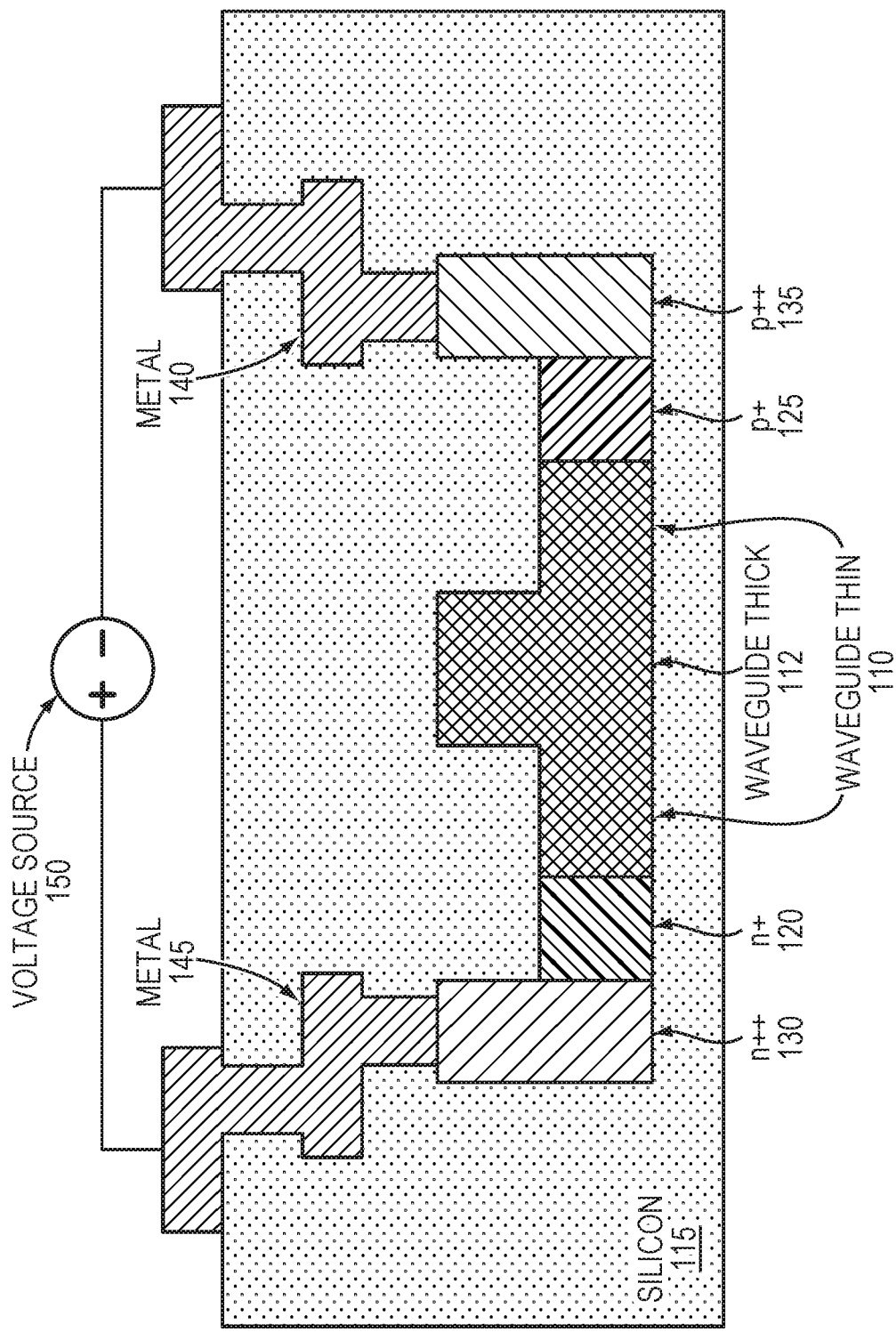
FIG. 1 is a simplified illustration of a waveguide with a voltage source applied across n and p, in accordance with an embodiment of the present disclosure.

A method and apparatus for removing free carriers from a waveguide using a p type semiconductor and an n type semiconductor connected by a short.

DETAILED DESCRIPTION

In certain embodiments, the current disclosure appreciates that when high optical power is introduced to a waveguide, the high optical power may cause undesired effects. In some embodiments, the current disclosure has realized that high optical power may heat a waveguide through optical absorption. In most embodiments, high optical power may cause a shift in frequency in a waveguide through increased heat. In most embodiments, high optical power may cause a shift in frequency in a ring resonator waveguide through increased heat. In certain embodiments, high optical power may lead to hysteresis and stability problems in a tunable laser. In some embodiments, with a ring resonator optical power may be enhanced at resonant wavelengths, which may make the ring resonator susceptible to nonlinear effects.

In most embodiments, when high optical power is sent into a waveguide, there may be two-photon absorption. In many embodiments, absorption due to high optical power may generate free electrons and holes (free carriers) which may lead to more optical absorption if the free carriers were not removed or recombined.

In certain embodiments, the current disclosure has realized that in non-linear optics applying a voltage to a connected p doped semiconductor and an n doped semiconductor may sweep out free carriers but may require extra electrical connections and electronics and may dissipate electrical power. In most embodiments, electrical power dissipation associated with using an external voltage may cause heating, which also may cause a noticeable frequency shift in a waveguide such as ring resonator. In many embodiments, the current disclosure may reduce the dominant nonlinearity in silicon waveguides, optically-induced free-carrier absorption, without requiring external electrical connections and electronics. In most embodiments, the current disclosure enables high-power lasers with intra-cavity ring resonators while saving chip size, packaging cost, electronics cost, and power consumption.

In most embodiments, the current disclosure may enable sweeping out free carriers by placing a p-n junction around a waveguide in which the p and n sides are electrically connected with low resistance. In most embodiments, the current disclosure places a p-n junction around a waveguide in which the p and n sides are shorted together via an electrical connection to sweep out free carriers. In almost all embodiments, no external voltage is needed to sweep out free carriers. In many embodiments, using a p-n junction with a short may enable a tunable laser.

Typically, in an n-type semiconductor, the majority of carriers are electrons and the minority of carriers are holes. Conventionally, an n-type semiconductors is fabricated by doping a semiconductor with impurities such as phosphorus. In many embodiments, it may be possible to distinguish between an n+ type semiconductor and an n++ type semiconductor by the amount of doping material used when fabricating the n type semiconductor. In certain embodiments, an n+ doping may be 5 times 10 to the $18^{th}$ per cubic centimeter of phosphorus. In certain embodiments, an n++ doping may be 1 times 10 to the $20^{th}$ per cubic centimeter of phosphorus.

Generally, in a p-type semiconductors, the majority of carriers are holes and the minority of carriers are electrons. Typically, p-type semiconductors are fabricated by doping a semiconductor with impurities such as boron. In many embodiments, it may be possible to distinguish between a p+ type semiconductor and a p++ type semiconductor by the amount of doping material used when fabricating the n type semiconductor. In certain embodiments, a p+ doping may be 5 times 10 to the $18^{th}$ per cubic centimeter of boron. In certain embodiments, a p++ doping may be 1 times 10 to the $20^{th}$ per cubic centimeter of boron.

In certain embodiments, the current disclosure may include an n++ doped semiconductor on one side of a waveguide and a p++ doped on a second side of a waveguide, where the n++ and p++ doped semiconductors are connected via an electrical short. In many embodiments, an electrical short may be any material or set of materials that electrically connect two other materials. In certain embodiments, an electrical short may be a piece of metal. In other embodiments, an electrical short may be multiple pieces of metal. In further embodiments, an electrical short may be any set of conductive elements.

In some embodiments, the current disclosure may include an n++ doped semiconductor coupled to a n+ semiconductor, the n+ semiconductor between a waveguide and the n++ doped semiconductor, and a p+ doped semiconductor on a second side of a waveguide between the second side of the wave guide and a p++ doped semiconductor, where the n++ and p++ doped semiconductors are connected via an electrical short. In some embodiments, additional implant levels may also be included.

In certain embodiments, a shorted p-n junction with a waveguide may be created during a fabrication process. In certain embodiments, a silicon oxide wafer may be etched. In some embodiments, implants corresponding to an n++ and p++ semiconductor may be added. In other embodiments, implants corresponding to an n+, n++, p+ and p++ semiconductor may be added. In other embodiments, implants corresponding to an n, n+, n++, p, p+ and p++ semiconductor may be added. In most embodiments, implants may be annealed. In many embodiments, oxide may be added over a waveguide and any n- and p-type semiconductors. In certain embodiments, a via to a waveguide with n- and p-type semiconductors may be made. In some embodiments, metal may be inside the via. In some embodiments, a metal layer, such as aluminum or copper, may connect the n- and p-type regions. In some embodiments, this connection may occur along an optical waveguide.

In most embodiments, a shorted p-n junction may create an electric field that extracts free carriers from a waveguide. In many embodiments, a shorted p-n junction may reduce or remove heating caused by free carriers by removing some or all of the free carriers. In certain embodiments, a shorted p-n junction may reduce or eliminate hysteresis and instability in a waveguide. In certain embodiments, a shorted p-n junction may reduce or eliminate hysteresis and instability in a ring resonator. In certain embodiments, a shorted p-n junction may reduce or eliminate hysteresis and instability in a tunable laser.

In many embodiments, an electrical short may be connected with a low resistance. In certain embodiments, an electrical short may have a resistance below less than 100Ω. In other embodiments, a high resistance may cause an electrical field across a p-n junction to decrease as the photocurrent increases, which may reduce effectiveness of a carrier sweep out. In most embodiments, an electrical short may have a short electrical path length between the p and n regions. In certain embodiments, a short electrical path transit time may be shorter than a carrier lifetime. In some embodiments, a short electrical path may be about 200 ps and less than about 2 cm.

Refer now to the example embodiment of FIG. 1, which shows a waveguide with p and n doping and an external voltage. In this embodiment, the waveguide has a thick portion 112 and a thin portion 110. On one side of the waveguide is an n+ 120 doped semiconductor, where the n+ 120 doped semiconductor is next to an n++ 130 doped semiconductor. On the other side of thin waveguide 110 is a p+ 125 doped semiconductor which is next to a p++ 135 doped semiconductor. Metal 145 is connected to n++ 130 doped semiconductor and metal 140 is connected to p++ 135 doped semiconductor. Waveguide thick portion 112, waveguide thin portion 110, n++ 130, n+ 120, p+ 125, p++ 135, metal 140, and metal 145 are surrounded by silicon 115. Connected to metal 140 and metal 145 is external voltage source 150. External voltage source provides voltage to n++ 130 and p++ 135 but also causes the waveguide to heat.

Figure 2:
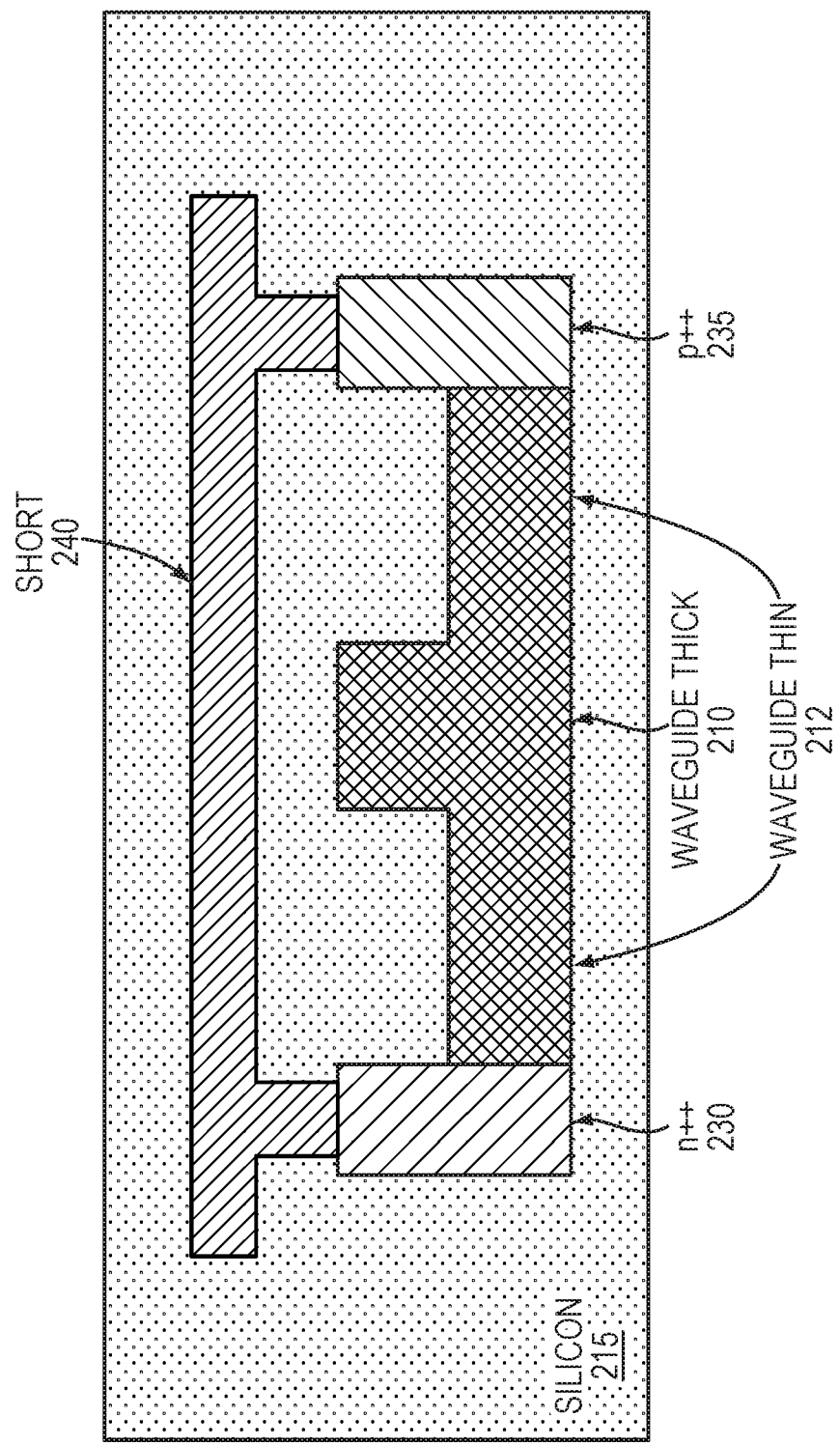
FIG. 2 is an illustration of a shorted n and p junction with a waveguide, in accordance with an embodiment of the present disclosure.

Refer now to the example embodiment of FIG. 2, which shows a waveguide with shorted p-n junction without external voltage. In this embodiment, waveguide has a thick portion 210 and a thin portion 212. On one side of the waveguide is an n++ 230 doped semiconductor. On the other side of thin waveguide 212 is a p++ 235 doped semiconductor. Short 240 is connected to n++ 230 doped semiconductor and to p++ 235 doped semiconductor. Waveguide thick portion 210, waveguide thin portion 210, n++ 230, p++ 235, and short 240 are surrounded by silicon 215. Short 240 connected by a first Vias and a second Vias causes a short between n++ 230 and p++ 235 and sweeps away free carriers preventing waveguide with thick portion 210 and thin portion 212 from heating up.

Figure 3:
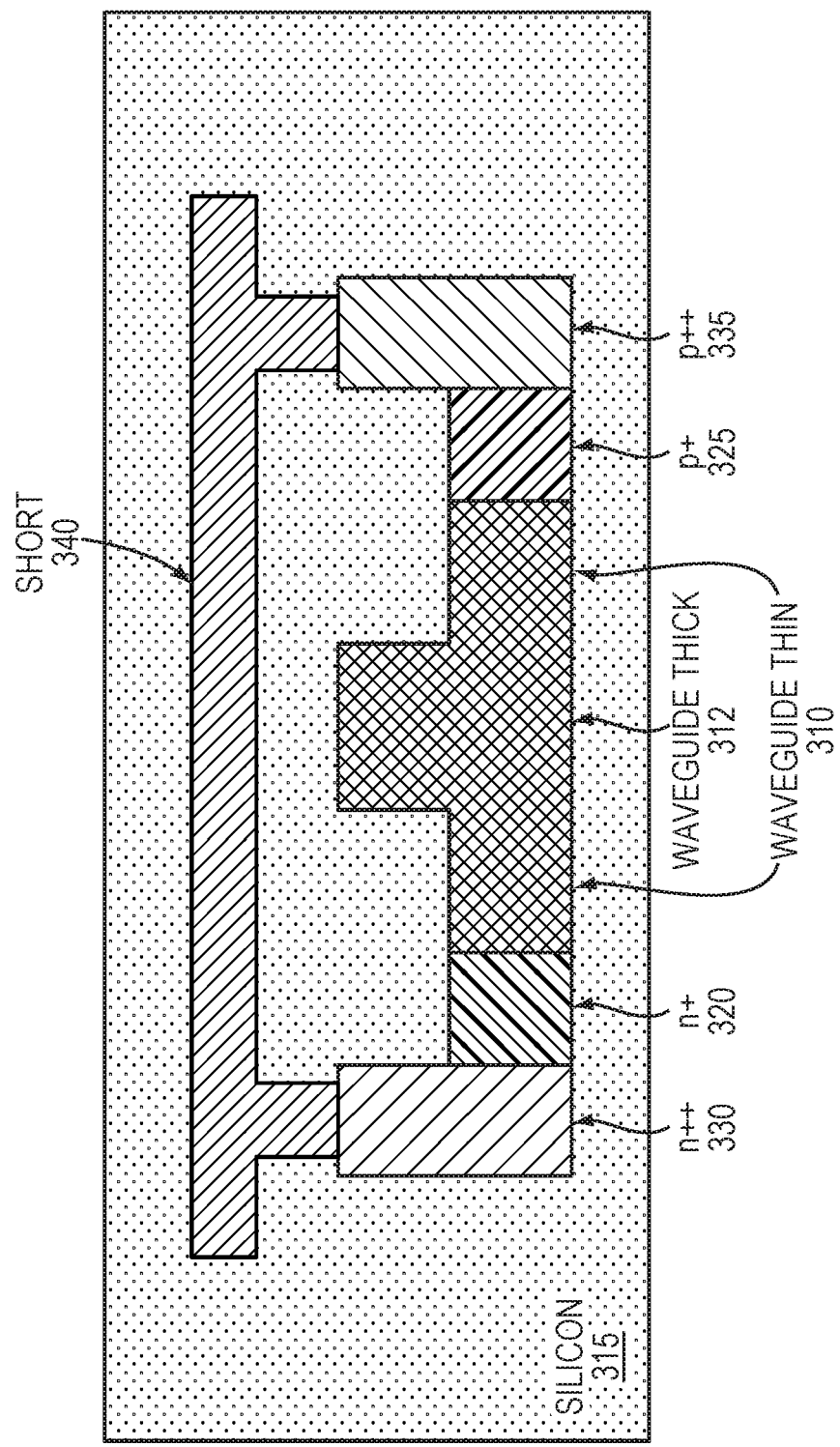
FIG. 3 is an alternative simplified illustration of a shorted n and p junction with a waveguide, in accordance with an embodiment of the present disclosure.

Refer now to the example embodiment of FIG. 3, which shows a waveguide with shorted p-n junction. In this embodiment, waveguide has a thick portion 312 and a thin portion 310. On one side of the waveguide is an n+ 320 doped semiconductor, where the n+ 320 doped semiconductor is next to an n++ 330 doped semiconductor. On the other side of thin waveguide 310 is a p+ 325 doped semiconductor which is next to a p++ 335 doped semiconductor. Short 340 is connected to n++ 330 doped semiconductor to p++ 335 doped semiconductor. Waveguide thick portion 312, waveguide thin portion 310, n++ 330, n+ 320, p+ 325, p++ 335, and short 340 are surrounded by silicon 315. Short 340 causes a short between n++ 330 and p++ 335 and sweeps away free carriers preventing waveguide with thick portion 312 and thin portion 310 from heating up. In other embodiments, n++/p++ doping may extend into thin silicon of a waveguide. In some embodiments, n++ and p++ dopings may occur on the thin silicon.

Figure 4:
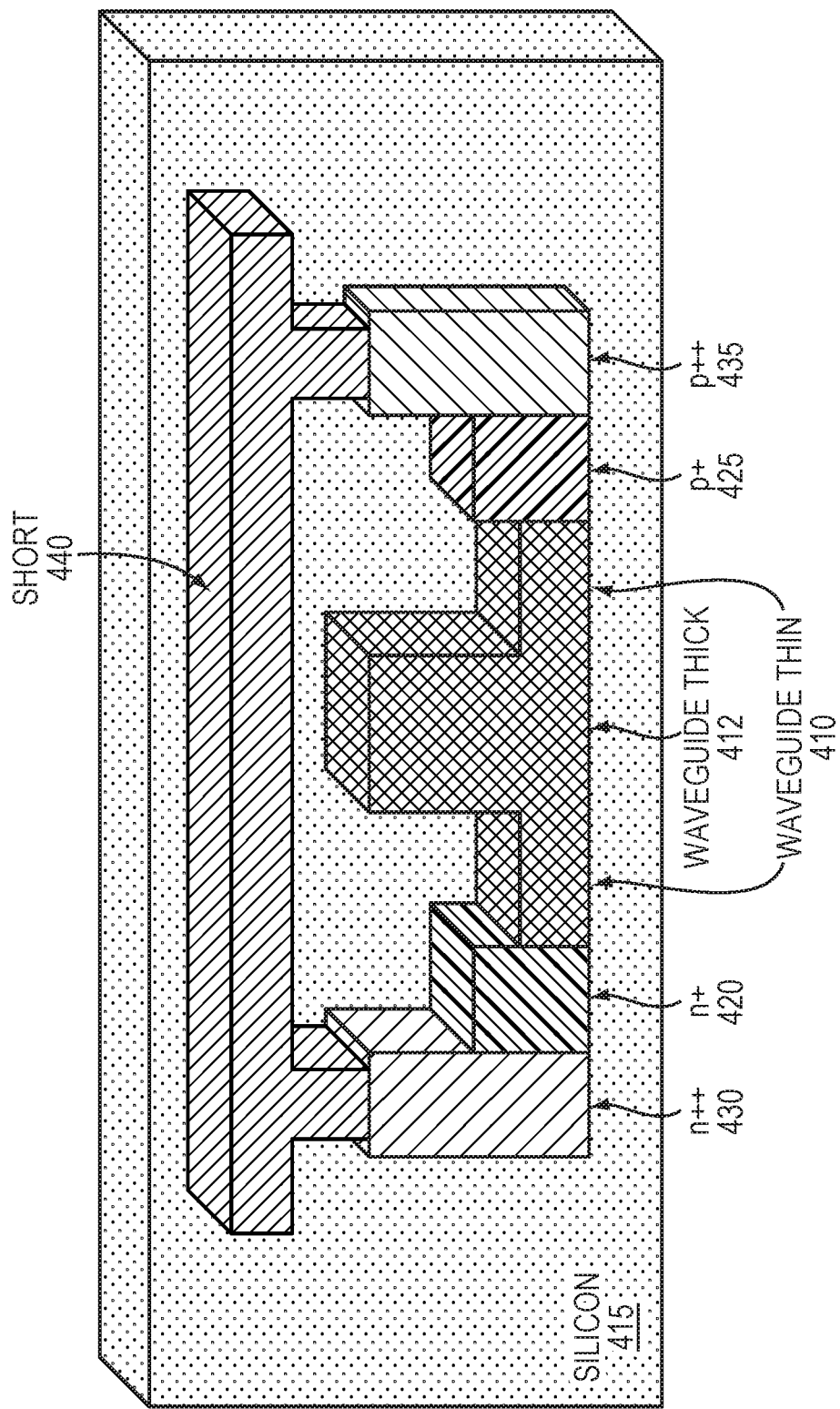
FIG. 4 an alternative illustration of FIG. 3 from a side perspective, in accordance with an embodiment of the present disclosure.

Refer now to the example embodiment of FIG. 4, which shows a 3 dimensional slice of the waveguide of FIG. 3. In this embodiment, waveguide has a thick portion 412 and a thin portion 410. On one side of the waveguide is an n+ 420 doped semiconductor, where the n+ 420 doped semiconductor is next to an n++ 430 doped semiconductor. On the other side of thin waveguide 410 is a p+ 425 doped semiconductor which is next to a p++ 435 doped semiconductor. Short 440 is connected to n++ 430 doped semiconductor to p++ 435 doped semiconductor. Waveguide thick portion 412, waveguide thin portion 410, n++ 430, n+ 420, p+ 425, p++ 435, and short 440 are surrounded by silicon 415. Short 440 causes a short between n++ 430 and p++ 435 and sweeps away free carriers Short waveguide with thick portion 412 and thin portion 410 from heating up.

Figure 5A:
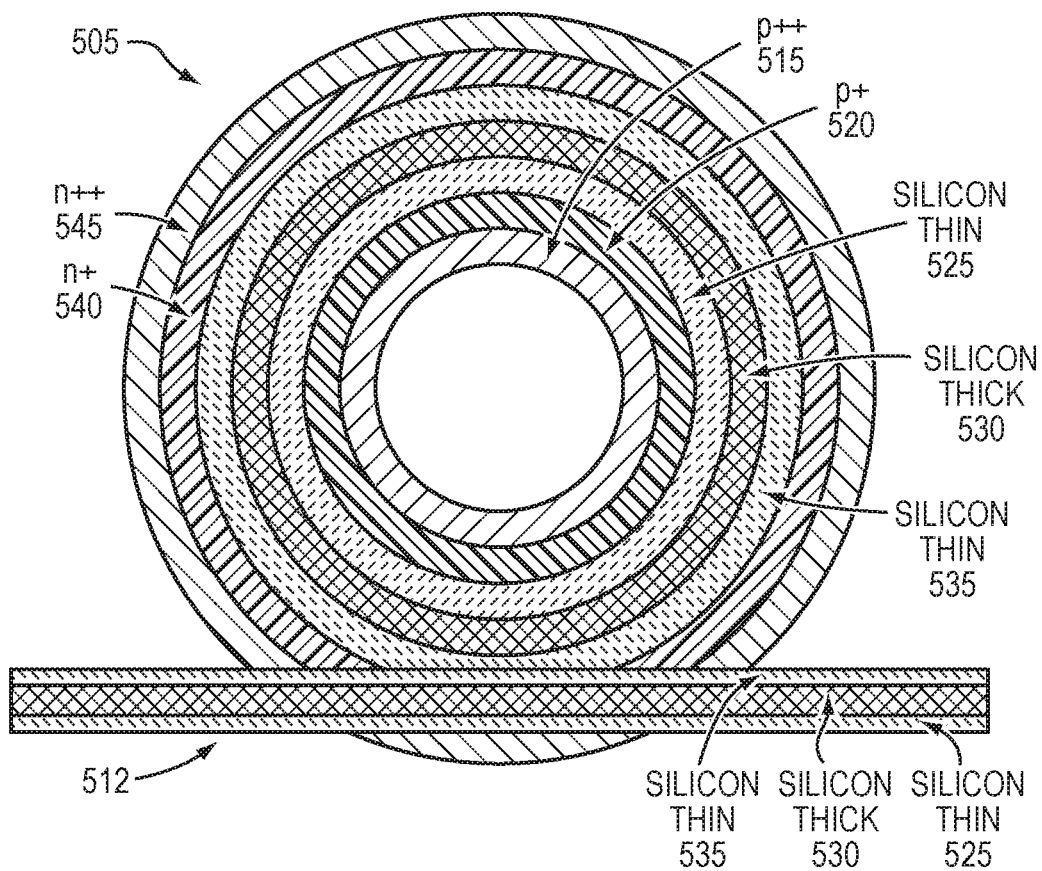
FIGS. 5a and 5b are simplified illustrations of a top cut away view and side cut away view of a ring resonator with a p-n short, in accordance with embodiments of the present disclosure.
Figure 5B:
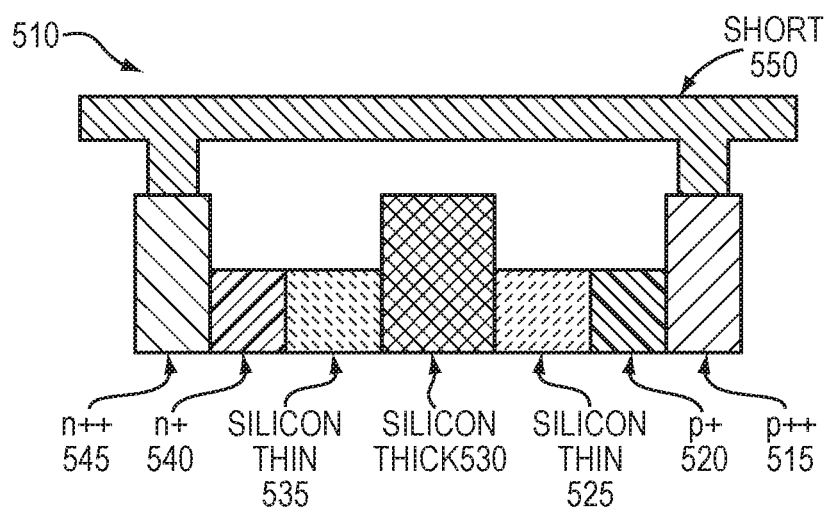

Refer now to the example embodiments of FIGS. 5a and 5b, which illustrates a top cut away view of a ring resonator and a side cut away view of the ring resonator. In the example embodiments of FIGS. 5a and 5b, ring resonator 505 is composed of a number of layers that correspond to side view of ring resonator 510. Ring resonator 505 has p++ 515 as an inner loop, next to p+ 520 as a surrounding loop, next to silicon tin layer 525, next to silicon thick layer 530, next to silicon thin layer 535, next to n+ layer 540, next to n++ layer 545. Not pictured in the top cut away view of ring resonator 505 is the p-n short. In the embodiments of FIGS. 5a and 5b, the shorting runs along the most of the ring resonator waveguide.

In the example embodiment of FIG. 5, side view of ring resonator 510 is composed of a number of layers that correspond to top view of ring resonator 505. Ring resonator 505 has p++ 515 as an inner loop, next to p+ 520 as a surrounding loop, next to silicon thin layer 525, next to silicon thick layer 530, next to silicon thin layer 535, next to n+ layer 530, next to n++ layer 545. Short 550 connects n++ 545 with p++ 515. Also shown is waveguide 512 coupling to the ring resonator. In the coupling region, the p-n junction arrangement becomes discontinuous and at one point there are two waveguides inside the junction. In this embodiment, the waveguide in the resonator is substantially surrounded with p-n junctions.

Figure 5C:
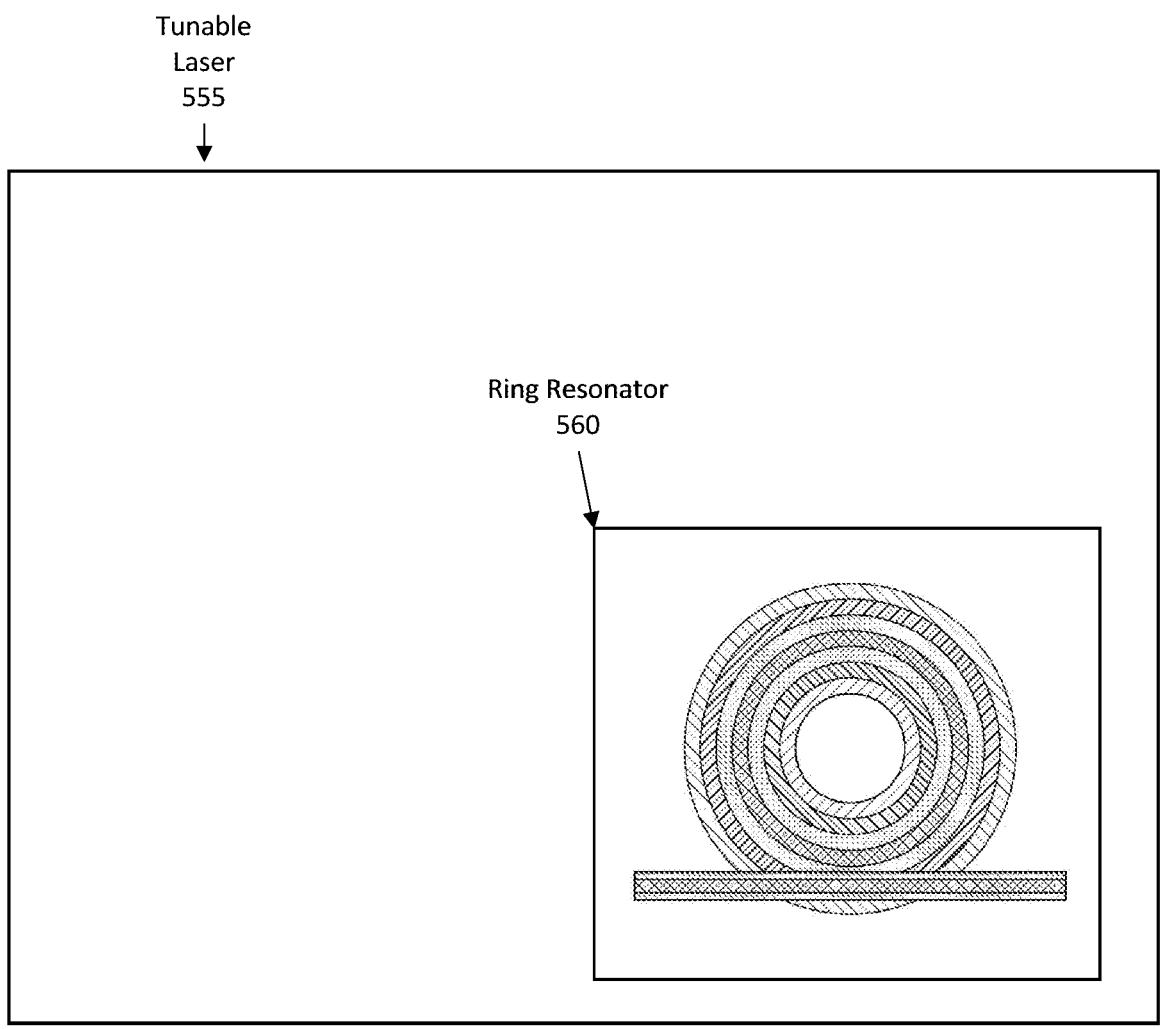
FIG. 5c is a simplified illustration of a top cut away view of a ring resonator with a p-n short within a tunable laser, in accordance with an embodiment of the present disclosure.

In the example embodiment of FIG. 5c there is tunable laser 555 and a top cut away view of ring resonator 560.

Having thus described several aspects and embodiments of the technology of this application, it is to be appreciated that various alterations, modifications, and improvements will readily occur to those of ordinary skill in the art. Such alterations, modifications, and improvements are intended to be within the spirit and scope of the technology described in the application. It is, therefore, to be understood that the foregoing embodiments are presented by way of example only and that, within the scope of the appended claims and equivalents thereto, inventive embodiments may be practiced otherwise than as specifically described. In addition, any combination of two or more features, systems, articles, materials, and/or methods described herein, if such features, systems, articles, materials, and/or methods are not mutually inconsistent, is included within the scope of the present disclosure.

Also, as described, some aspects may be embodied as one or more methods. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

The phrase "and/or," as used herein in the specification and in the claims, should be understood to mean "either or both" of the elements so conjoined, i.e., elements that are conjunctively present in some cases and disjunctively present in other cases.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The terms "approximately" and "about" may be used to mean within ±20% of a target value in some embodiments, within ±10% of a target value in some embodiments, within ±5% of a target value in some embodiments, and yet within ±2% of a target value in some embodiments. The terms "approximately" and "about" may include the target value.

In the claims, as well as in the specification above, all transitional phrases such as "comprising," "including," "carrying," "having," "containing," "involving," "holding," "composed of," and the like are to be understood to be open-ended, i.e., to mean including but not limited to. The transitional phrases "consisting of" and "consisting essentially of" shall be closed or semi-closed transitional phrases, respectively.

The terms "approximately" and "about" may be used to mean within ±20% of a target value in some embodiments, within ±10% of a target value in some embodiments, within ±5% of a target value in some embodiments, or within ±2% of a target value in some embodiments. The terms "approximately" and "about" may include the target value.

What is claimed is:

1. An apparatus comprising:
   an intra-cavity ring resonator with a p type semiconductor and an n type semiconductor; wherein the p type semiconductor and the n type semiconductor are connected via an electrical short from the p type semiconductor to the n type semiconductor; wherein an electrical path of the short is smaller than a free carrier lifetime.

2. The apparatus of claim 1 wherein the p type semiconductor includes a p++ semiconductor and the n type semiconductor includes an n++ type semiconductor.

3. The apparatus of claim 2 wherein the p type semiconductor includes a p+ semiconductor and the n type semiconductor includes an n+ type semiconductor.

4. The apparatus of claim 1 wherein the intra-cavity ring resonator is on a chip and the short is made using on-chip metals.

5. The apparatus of claim 1 wherein the short occurs across a portion of the intra-cavity ring resonator.

6. The apparatus of claim 1 wherein the short occurs across a substantial portion of the intra-cavity ring resonator.

7. The apparatus of claim 1 wherein the intra-cavity ring resonator is part of a tunable laser.

8. A method comprising:
   removing free carriers from an intra-cavity ring resonator using a p type semiconductor and an n type semiconductor connected by a short with an electrical path smaller than a free carrier lifetime by shorting the free carrier before it heats the intra-cavity ring resonator.

9. The method of claim 8 wherein the p type semiconductor includes a p++ semiconductor and the n type semiconductor includes an n++ type semiconductor.

10. The method of claim 9 wherein the p type semiconductor includes a p+ semiconductor and the n type semiconductor includes an n+ type semiconductor.

11. The method of claim 8 wherein the intra-cavity ring resonator is on a chip and the short is made using on-chip metals.

12. The method of claim 8 wherein the short occurs across a portion of the intra-cavity ring resonator.

13. The method of claim 8 wherein the short occurs across a substantial portion of the intra-cavity ring resonator.

14. The method of claim 8 wherein the intra-cavity ring resonator is part of a tunable laser.

15. A system comprising:
    a tunable laser, and
    an intra-cavity ring resonator with a p type semiconductor and an n type semiconductor; wherein the p type semiconductor and the n type semiconductor are connected via an electrical short from the p type semiconductor to the n type semiconductor; wherein an electrical path of the short is smaller than a free carrier lifetime.

16. The apparatus of claim 15 wherein the p type semiconductor includes a p++ semiconductor and the n type semiconductor includes an n++ type semiconductor.

17. The apparatus of claim 16 wherein the p type semiconductor includes a p+ semiconductor and the n type semiconductor includes an n+ type semiconductor.

18. The apparatus of claim 15 wherein the intra-cavity ring resonator is on a chip and the short is made using on-chip metals.

19. The apparatus of claim 15 wherein the short occurs across a portion of the intra-cavity ring resonator.

20. The apparatus of claim 15 wherein the short occurs across a substantial portion of the intra-cavity ring resonator.

* * * * *